United States Patent [19]

Rittenbach

[11] 4,426,622

[45] Jan. 17, 1984

[54] FREQUENCY DISCRIMINATOR

[75] Inventor: Otto E. Rittenbach, Neptune, N.J.

[73] Assignee: The United States of America as represented by the Secretary of the Army, Washington, D.C.

[21] Appl. No.: 296,026

[22] Filed: Aug. 25, 1981

[51] Int. Cl.³ .............................................. H03D 3/06
[52] U.S. Cl. .................................. 329/143; 307/519; 328/141; 329/110; 329/140
[58] Field of Search ..................... 307/513, 519, 522; 328/140, 141; 329/110, 137, 138, 140, 143; 455/150, 214

[56] References Cited

U.S. PATENT DOCUMENTS 2,844,720  7/1958  Gilbert ................................ 328/141
3,546,609 12/1970  Boyajian ............................ 329/143
4,359,694 11/1982  Suenaga ............................ 329/143
4,375,618  3/1983  Jett, Jr. ............................ 329/137

Primary Examiner—John Zazworsky
Attorney, Agent, or Firm—Robert P. Gibson; Jeremiah G. Murray; Edward Goldberg

[57] ABSTRACT

A new type of frequency discriminator in which the signal is applied to a pair of channels, one of which includes a frequency pass circuit which may comprise a parallel resonant circuit, and the other a frequency stop circuit which may comprise a resonant trap. The channels also include means to differentially shift the phases of the signals therein by 90°. The two channel outputs are applied to an analog multiplier and the dc value of the output thereof is the discriminator output.

12 Claims, 12 Drawing Figures

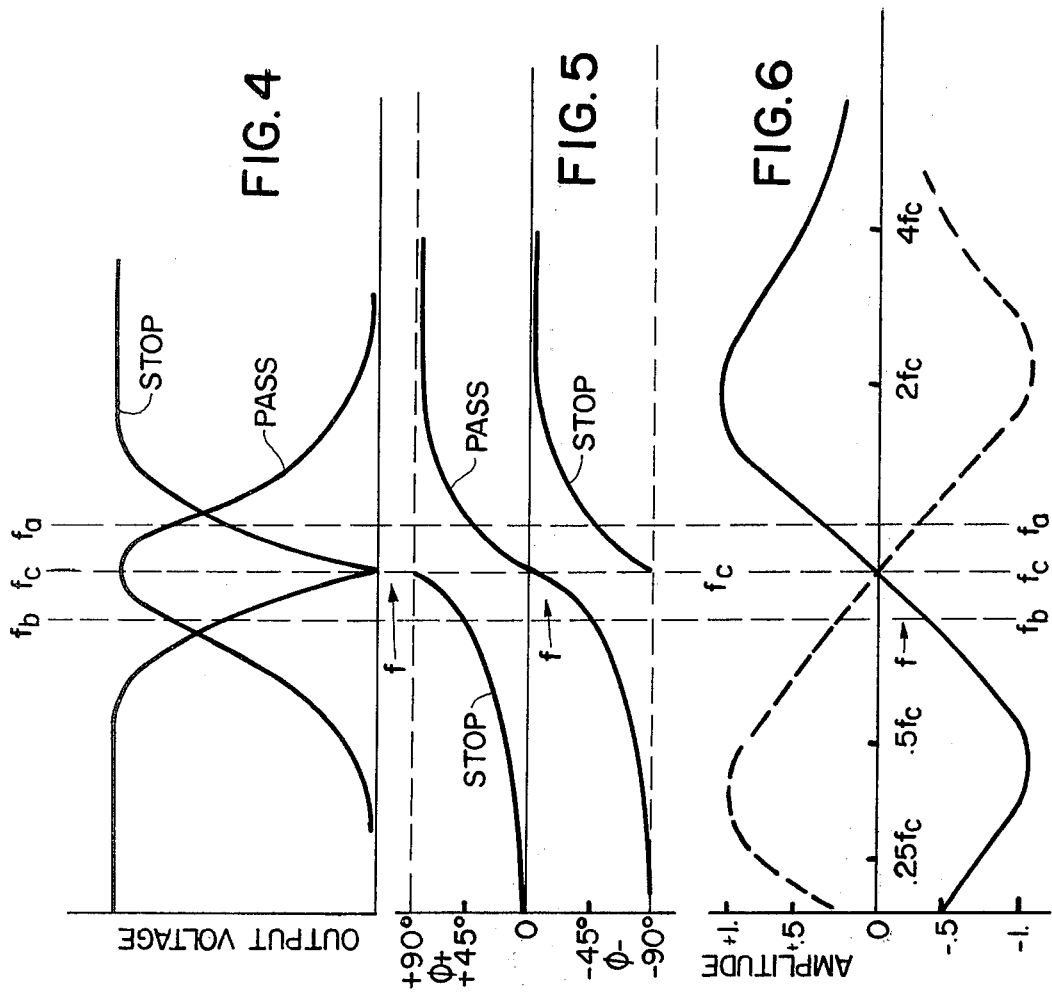

FREQUENCY DISCRIMINATOR

The invention described herein may be manufactured, used, and licensed by or for the Government for governmental purposes without the payment to me of any royalties thereon.

BACKGROUND OF THE INVENTION

The field of this invention is electronic circuitry for producing an output voltage which varies in magnitude and polarity with the frequency of an applied signal. Such circuits are known as frequency discriminators and are widely used in such applications as frequency modulation (fm) receivers, radar sets and frequency meters. Well known types of discriminators are the Foster-Seeley discriminator and the ratio detector.

In the past it has been known that fm signals can be received on amplitude modulation (am) receivers by detuning the fm carrier to one of the skirts (or the sloping portion) of the receiver' intermediate frequency stages. In this way the frequency modulation is converted into amplitude modulation which is then detected by the receiver's detector. A more sophisticated frequency discriminator utilizing this principle has also been known in the prior art. This prior art discriminator comprises a pair of parallel resonant circuits, one tuned above the center frequency and the other an equal amount below it. The input frequency is applied in parallel to both tuned circuits and the outputs of both circuits are separately rectified by means of oppositely polarized diodes, and the rectified voltages combined to form the discriminator output.

The present invention is a frequency discriminator which operates on a completely different principle from any known prior art discriminator and which has important advantages over prior circuits of this type. The novel discriminator includes a pair of tuned circuits both tuned to the same frequency, the center frequency. One of these circuits is a frequency pass circuit and the other a frequency stop circuit. The input frequency is split into two channels and differentially phase shifted by 90° before application to the two tuned circuits. The phase shifts undergone by the signals in the two tuned circuits are such that above the center frequency the outputs of the two tuned circuits are always co-phasal, and below the center frequency they are always 180° out of phase. Thus the product (or dc component) of these tuned circuit outputs will be negative below the center frequency and positive above it, or vice versa. Further, the output of one of these circuits is zero at the center frequency and the output of the other approaches zero at zero frequency and at infinitely high frequency. The tuned circuit outputs are multiplied by one another and the product will have an S-shaped curve which is a necessary characteristic of a discriminator.

SUMMARY OF THE INVENTION

The tuned circuits comprise a parallel resonant filter and a parallel resonant trap, both tuned to the same frequency which is the discriminator center frequency. The input signal, after passing through a broadly tuned bandpass filter, is split into two equal components and is differentially phase shifted by 90°. One of the phase shifted signals is applied to the parallel resonant circuit (or frequency pass circuit), and the other signal to the tuned trap (or frequency stop circuit). The outputs of the two circuits are applied to an analog multiplier and thence to a low pass filter which removes the alternating component therefrom and passes the dc component. The output is a dc voltage which is zero at the center frequency, negative just below it and positive just above it.

In a variation of the invention, the tuned circuits can be replaced by resistor-capacitor (RC) circuits or resistor-inductor (RL) circuits, with outputs taken from the resistor in one channel and from the capacitor or inductor in the other channel.

In another variation of this circuit, the two resonant circuits can be replaced by a single frequency splitter which performs the function of both the frequency pass and frequency stop circuits.

BRIEF DESCRIPTION OF THE DRAWINGS

FIG. 3 is a block diagram of a slightly different version of the novel discriminator.

FIGS. 4–6 are curves illustrating the mode of operation of the circuits of FIGS. 2 and 3.

DETAILED DESCRIPTION OF A PREFERRED EMBODIMENT

Figure 1:
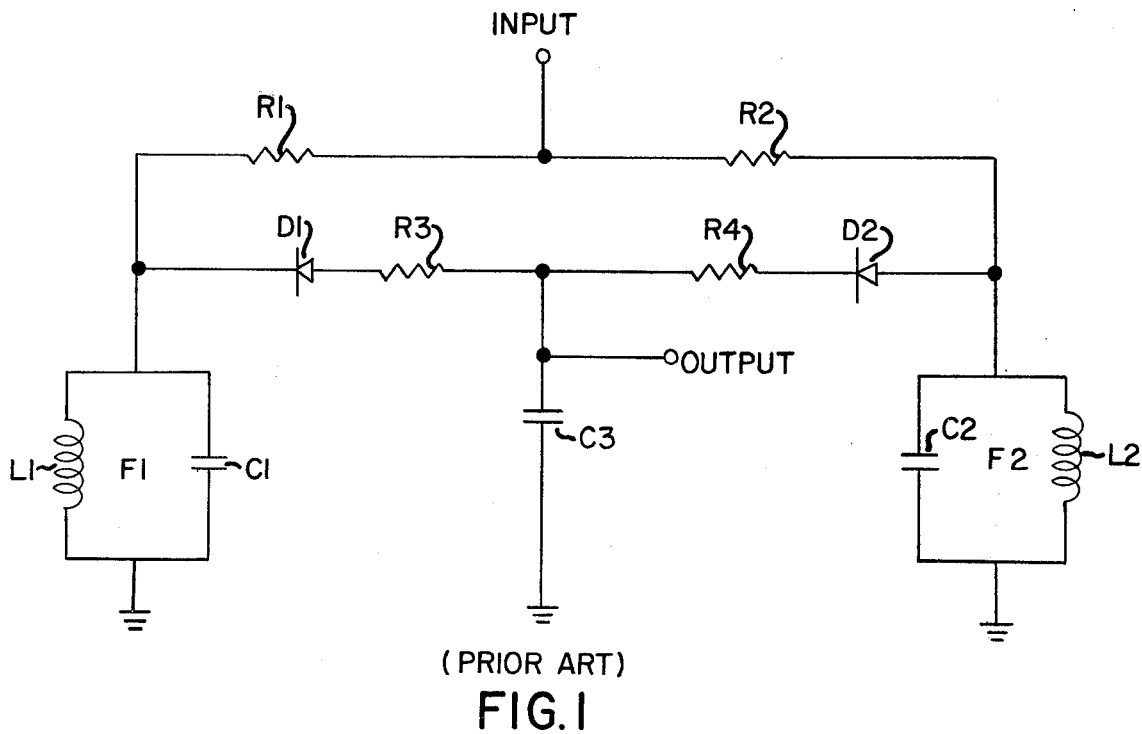
FIG. 1 is a circuit diagram on one form of prior art discriminator.

The prior art discriminator of FIG. 1 is shown and described because it somewhat resembles the novel discriminator of the other Figures and an understanding of the differences between this prior art circuit and the present invention will help to point out the mode of operation of the invention.

The circuit of FIG. 1 includes an input terminal which is connected through resistor R1 to a first parallel resonant circuit comprising inductor L1 and capacitor C1, and to a second parallel resonant circuit comprising inductor L2 and capacitor C2 through resistor R2. The first parallel resonant circuit has a resonant frequency, F1, which is below the center frequency of the discriminator, and the second parallel resonant circuit has a resonant frequency, F2, which is an equal amount above the center frequency. A rectifier diode D1 has its anode connected to the first resonant circuit and another similar diode D2 has its cathode connected to the second resonant circuit, as shown. The outputs of the diodes are combined by means of resistors R3 and R4 which are connected to the output terminal. The capacitor C3 together with the resistors in series therewith function as a smoothing filter or low pass filter. At the center frequency, which is halfway between the two resonant frequencies, the voltages across each resonant circuit will be equal, but since the diodes are oppositely poled, the sum of the rectified voltages at the output terminal will be zero. Below the center frequency the first resonant circuit will develop a higher voltage since the input frequency is closer to its resonant frequency. Thus the negative voltage output from diode D1 will be greater than the positive voltage output from D2, and the combined output will be negative. Similarly, at frequencies just above the center frequency, the positive voltage developed across the second resonant circuit will predominate to yield a positive output. Thus this circuit exhibits the S-curve required for frequency discrimination.

Figure 2:
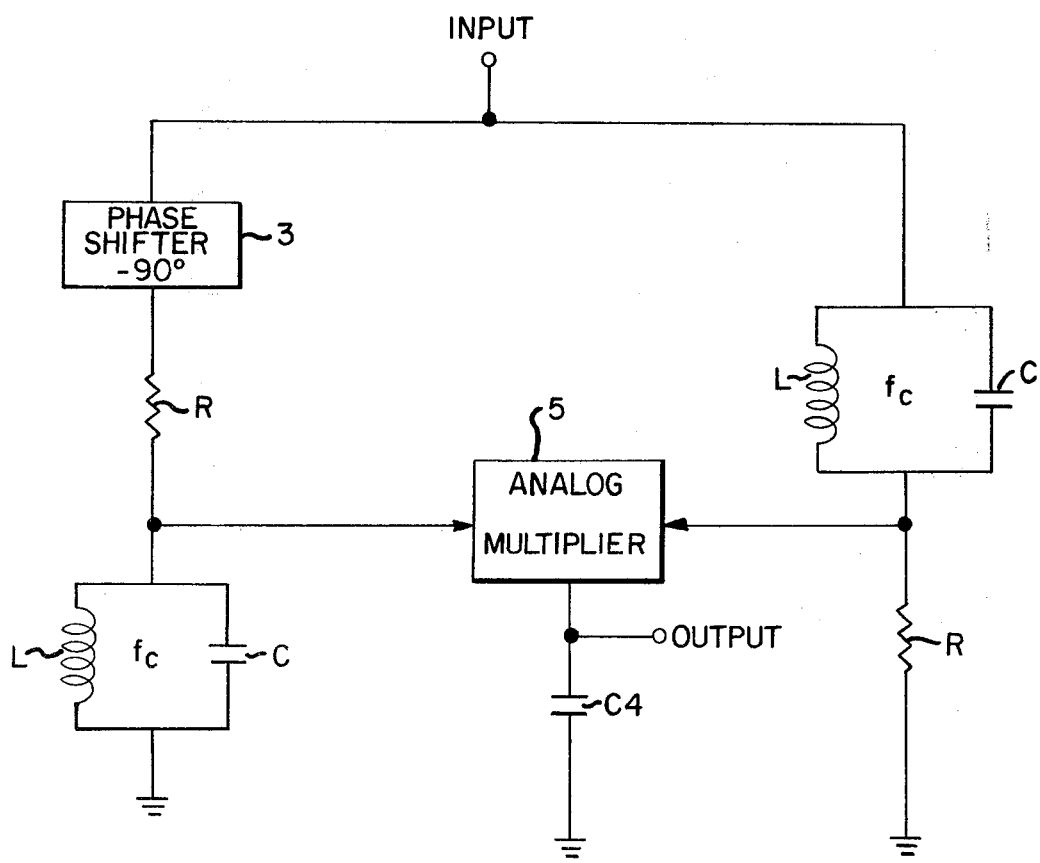
FIG. 2 is a circuit diagram of one version of the novel discriminator of the present invention.

The version of the invention shown in the simplified diagram of FIG. 2 includes an input terminal which is connected in parallel to a pair of channels, both of which include parallel resonant circuitry comprising inductors L and capacitors C, both tuned to the same frequency, $f_c$, the discriminator center frequency. Both resonant circuits have resistors R in series therewith, but in one channel, the left channel in FIG. 2, the resonant circuit is connected to ground whereas in the other channel the series resistor R is grounded. With this circuitry, the resonant circuitry of the left channel functions as a frequency pass circuit since the impedance of the parallel resonant circuit is maximum at resonance and is selected to be many times the value of the series resistor, R. The circuitry of the right channel functions as a frequency stop circuit or trap since at resonance the high impedance of the parallel LC circuit will prevent any substantial portion of the input from appearing across the series resistor R of the right channel.

One of the channels, the left channel of FIG. 2 includes a phase shifter 3 between the input terminal and the frequency pass circuit of that channel. This phase shifter is designed to retard the phase of the applied signal by 90°. Instead of a single −90° phase shifter in one channel, the circuitry may utilize one 45° phase shifter in each of the two channels. This modification is illustrated in the embodiment of FIG. 3 which includes a −45° phase shifter 9 in the frequency pass channel and a +45° phase shifter 11 in the frequency stop channel. Also, the same effect can be achieved with a single +90° phase shifter in the frequency stop channel. The object is to achieve a phase of +90° at the frequency stop input relative to that at the frequency pass input. This can be achieved with any pair of phase shifters in the two channels, as long as the proper 90° phase difference results.

Returning to FIG. 2, the outputs of the two channels are applied to an analog multilier 5, and the product of the two inputs is applied to the output terminal. The capacitor C4 acts as a low pass or smoothing filter which absorbs any alternating components in the multiplier output, for example it will absorb voltages at the input frequency and harmonics thereof. The internal resistance of the multiplier is effectively in series with the capacitor C4, thus the circuit forms an RC filter. The analog multiplier can be an electromechanical device such as a wattmeter movement comprising a pair of coils, one of which is free to rotate with respect to the other and wherein interaction of the magnetic fields and currents of the coils produces a torque proportional to the product of the applied signals. Alternatively, the multiplier can be a purely electronic device with no moving parts which performs the desired function. It is evident that the frequency stop circuit will have substantially zero output at resonance which is also the center frequency of the discriminator, thus the product will also be substantially zero at this frequency. Just below resonance the output will be negative and just above resonance it will be positive.

In the embodiment of FIG. 3, in addition to the use of 45° phase shifters in each channel, the circuit includes an optional bandpass filter 7, which is broadly tuned to pass all of the frequencies within the range of the discriminator, and to attenuate noise and other signals outside this range. In FIG. 3, the frequency pass circuit 13 and frequency stop circuit 15 are shown in block form. The multiplier 17 is similar to the same element in FIG. 2, and the low pass filter 19 is also shown in block form.

FIG. 4 illustrates the impedance characteristic of the frequency pass and frequency stop circuits of FIGS. 2 and 3. The frequency pass circuit exhibits the resonant peak typical of parallel resonant circuit with a maximum output voltage at the resonant frequency of $f_c$, with the output decreasing on either side of the peak. The frequency stop or trap circuit output voltage is seen to be zero at $f_c$ and rises to a high output plateau on either side of resonance. FIG. 5 illustrates the phase shifts undergone by the signals in traversing the frequency pass and stop circuits. As shown, the frequency pass circuit exhibits a phase shift of −90° far below resonance, zero phase shift at resonance, and positive phase shifts above resonance. The stop circuit phase shift approaches zero far below and far above resonance and approaches +90° below resonance at the 3dB point and −90° just above resonance, with a discontinuity at resonance. If the applied input signal is just below resonance, for example at frequency $f_b$ in FIGS. 4, 5 and 6, the phase shift of the frequency pass circuit will be approximately −45° and that of the frequency stop circuit approximately +45°. Since the input to the frequency stop circuit is +90° relative to that at the frequency pass circuit due to the action of the phase shifter or phase shifters in the circuits of FIGS. 2 and 3, the phase at the output of the frequency pass circuit will be approximately −45° and that at the output of the frequency stop circuit will be +90° plus 45° or +135°. Above resonance, for example at frequency $f_a$ of FIGS. 4, 5 and 6, the frequency pass circuit exhibits a phase shift of approximately +45° and the stop circuit approximately −45°. Thus the multiplier input phases will be both approximately +45° at this frequency. Thus the multiplier circuit inputs are always of opposite phase below resonance and always of the same phase above resonance. Thus the multiplier output is negative below resonance and positive above resonance. Further, there will be positive and negative peaks in the product just below and just above resonance, to form the familiar S-curve of a frequency discriminator. The S-curve is shown in FIG. 6. Since the output of the frequency pass circuit approaches zero at both high and low frequencies, it is obvious that the product of its output with any other function will similarly approach zero at high and low frequencies. At some intermediate values below resonance and above resonance, the product of the outputs of these two circuits will exhibit the maxima or peaks required to form an S-curve. In FIG. 6, these peaks occur at about $0.5f_c$ and $2f_c$.

The dashed line curve of FIG 6 is an S-curve with the maxima reversed in polarity relative to the solid line S-curve which is the characteristic of the circuits of FIGS. 2 and 3. The reversed curve would be obtained if the relative phases at the inputs to the frequency pass and stop circuits were reversed. For example, if the phase at the frequency pass input were +90° relative to that at the frequency stop input, the dashed line curve of FIG. 6 would be obtained. Such a reversed curve would be satisfactory for many applications and could be compensated for in other applications. For example, if such a reversed curve discriminator were used in an fm receiver as a demodulator, the only effect would be that the audio signal would be reversed in phase compared to the audio which was broadcast at the transmitter. Such a phase reversal would be undetectable to most listeners.

It is apparent also that the phase shifter or phase shifters can follow the frequency pass and stop circuits in the two channels. For example, in FIG. 3 the positions of phase shifter 9 and the frequency pass circuit 13 could be interchanged and likewise the positions of phase shifter 11 and frequency stop circuit 15. The important point is to maintain the proper phase relations as described above at the multiplier inputs.

Figure 9:
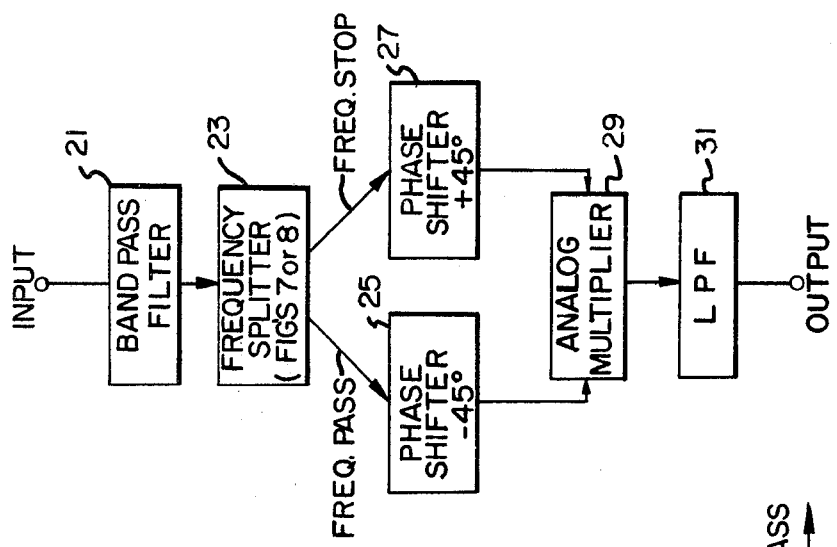
FIG. 9 is a block diagram of a version of the discriminator which uses a frequency splitter.
Figure 7:
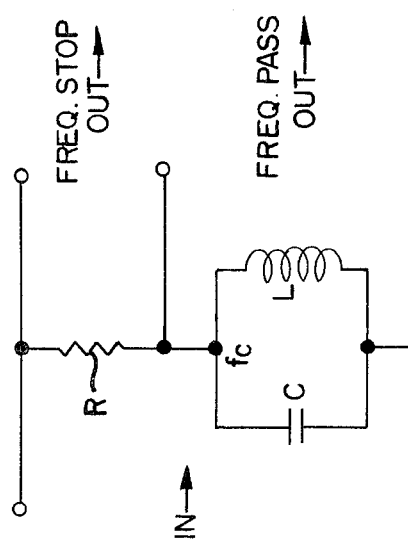
FIGS. 7 and 8 are circuit diagrams of frequency splitters.
Figure 8:
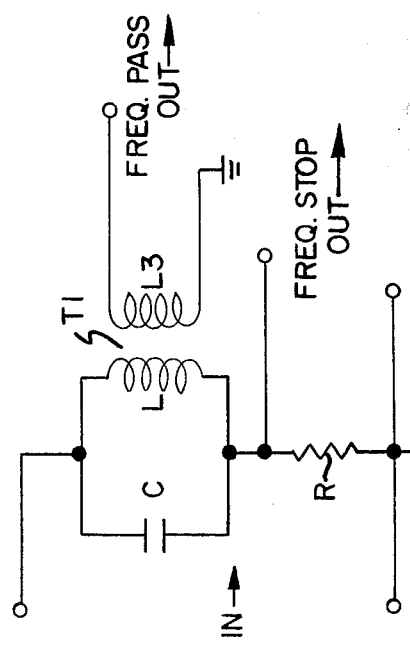

The block diagram of FIG. 9 shows a version of the circuit which uses a single frequency splitter which can include only a single resonant circuit which performs the functions of both the frequency pass and frequency stop circuits of the previously described embodiments. In FIG. 9 the input is filtered by filter 21 which is similar to filter 7 of FIG. 3 and then applied to frequency splitter 23, which has frequency pass and frequency stop outputs, as shown. The frequency pass output is applied to a $-45°$ phase shifter 25 and the frequency stop output to a $+45°$ phase shifter 27. These are analogous to the phase shifters 9 and 11 of FIG. 3. The phase shifted outputs of circuits 25 and 27 are multiplied in analog multiplier 9 and the product is filtered by low pass filter 31. Circuits 29 and 31 are the same in design and function as the previously described circuits 17 and 19 of FIG. 3. The details of frequency splitters which can be used in the circuit of FIG. 9 are shown in FIGS. 7 and 8. FIG. 7 shows a parallel resonant circuit comprising inductor L and capacitor having a resonant frequency $f_c$, the center frequency of the discriminator. A resistor R is in series with the LC circuit. The input is applied via a pair of terminals labeled 'In' to the series-parallel RLC circuit, as shown. The frequency pass output comprises the voltage across the parallel resonant circuit and the frequency stop output comprises the voltage across the series resistor R. It is apparent that the frequency pass output will peak at resonance and decrease on either side thereof and the frequency stop output will function as a trap to block signals at the center frequency. The circuit of FIG. 7 has the disadvantage that one of the outputs thereof is floating relative to the other, and this can cause circuit difficulties. The frequency splitter of FIG. 8 overcomes this problem by providing two single-ended outputs, both of which have one side grounded. This circuit includes a series-parallel LC and R circuit like that of FIG. 7, but with the series resistor R grounded. The frequency stop output is the voltage across R, one side of which is grounded. The frequency pass output is taken from the parallel resonant circuit by means of a transformer coil L3 which is inductively coupled to coil L. One side of coil L3 can be grounded, as shown, to provide the desired result of two single-ended outputs. As in the previous embodiments, a single 90° phase shifter can be utilized in the circuit of FIG. 9, in place of the two 45° phase shifters shown. The circuit of FIG. 9 functions in the same way as those of FIGS. 2 and 3 to yield an output voltage proportional to the frequency of the applied input signal.

With the circuits of FIGS. 2 and 3, the two resonant circuits must be tuned precisely to the same frequency and any departure from this condition will degrade the performance of the circuit. This problem is eliminated when the single resonant circuit is used as in the embodiment of FIG. 9.

Figure 10:
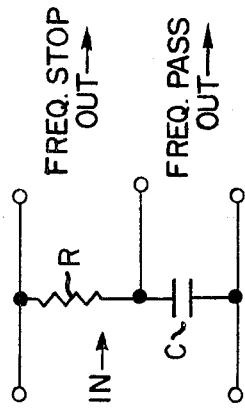
FIGS. 10–12 show frequency splitters which comprise merely series connected resistor and capacitor.
Figure 11:
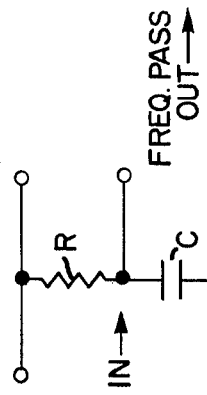
Figure 12:
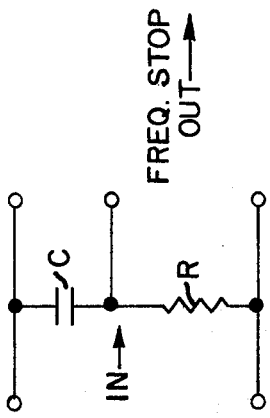

FIGS. 10, 11 and 12 represent frequency splitters composed of RC circuits only. FIG. 10 comprises a resistor R in series with a capacitor C, with the input applied across both the circuit elements, and the frequency stop output being the voltage across the resistor and the frequency pass output that across the capacitor. The circuit of FIG. 10 can be thought of as the circuit of FIG. 7 with an infinitely high inductance, L. A parallel LC circuit with L equal to infinity has a resonant frequency of zero, since the resonant frequency varies with the square root of the inductance. If the resonant frequency of the LC circuits of FIGS. 2, 3, or 9 approached zero, the result would be a discriminator with a center frequency of zero. Such discriminator would not exhibit an S-curve, but one half of an S-curve, namely the half to the right of the center frequency, $f_c$, of FIG. 6. Such a discriminator can be useful for many purposes, for example, if the input center frequency is selected to be above zero frequency by the amount of the maximum frequency deviation, frequency discrimination can be acheived. Thus the circuit of FIG. 10 can be used in the discriminator of FIG. 9 in place of the frequency splitter of FIG. 7. In order to obtain the benefits of a pair of single-ended outputs, separate frequency pass and frequency stop RC circuits can be used. These are shown in FIGS. 11 and 12. In FIG. 11 the capacitor C is grounded and thus the capacitor voltage forms the grounded frequency pass output, while in FIG. 12, the voltage across the grounded resistor R forms the frequency stop output.

An important advantage of the RC circuits of FIGS. 10–12 is that RC circuits lend themselves to automated production by printed and integrated circuit techniques while inductors do not. It is possible to devise circuits analogous to these RC circuits which are RL circuits. An RL circuit can be thought of as an RLC circuit such as that of FIG. 7, with a capacity C of zero, and hence an infinite capacitive reactance. Such an RL circuit could be made to function as a zero center frequency discriminator, however in many cases it would not be as desirable as the RC circuit because of the above-noted difficulty of producing inductors by automated techniques.

Since the output of this discriminator varies with the magnitude of the input signal, it may in certain applications be desirable to pass the input signal through a limiter before application to the present discriminator.

While the invention has been described in connection with certain embodiments, other variations therein will be obvious to those skilled in the art without the exercise of invention, hence the invention should be limited only by the scope of the appended claims.

I claim:

1. A frequency discriminator, comprising; an input terminal, means to connect said input terminal in parallel to a pair of channels, one of said channels comprising a 90° phase shifter and a frequency pass circuit in cascade and the other of said channels comprising a frequency stop circuit, said frequency pass circuit and frequency stop circuit both tuned to the same frequency, said frequency being the discriminator center frequency, means to apply the outputs of said two channels to an analog multiplier, and a low pass filter connected to the output of said analog multiplier.

2. The circuit of claim 1 wherein said frequency pass circuit comprises a parallel resonant filter and said frequency stop circuit comprises a parallel resonant trap.

3. The circuit of claim 1 wherein said frequency pass circuit comprises a series connected resistor-capacitor with said capacitor grounded and said frequency stop circuit comprises a series connected resistor-capacitor with said resistor grounded.

4. The circuit of claim 1 further including a broadly tuned bandpass filter tuned to said center frequency connected between said input terminal and said two channels.

5. A frequency discriminator comprising an input terminal, means to connect said input terminal to first and second channels in parallel, said first channel comprising a frequency stop circuit and said second channel comprising a frequency pass circuit, both of said circuits being tuned to the same frequency, said same frequency being the center frequency of said discriminator, means in one or both of said channels to produce a +90° phase shift in said first channel relative to said second channel, and means connected to said first and second channels to multiply the outputs thereof, the product of said outputs being the output of said discriminator.

6. A frequency discriminator comprising an input terminal, means to connect said input terminal to a frequency splitter, said frequency splitter comprising a parallel inductance-capacitance circuit in series with a resistor, said frequency splitter having one input and two outputs, said one input being applied across said series-parallel resistor-capacitor-inductor circuit, one of said two outputs being the voltage across said resistor and the second of said two outputs being the voltage across said parallel inductance-capacitance circuit, means to connect said two outputs of said frequency splitter to the two inputs of an analog multiplier via phase shifting means adapted to shift to the relative phases of signals in said outputs by 90°, and a low pass filter connected to the output of said analog multiplier.

7. A frequency discriminator comprising; a frequency splitter having an input, a frequency stop output and a frequency pass output, means to apply a signal whose frequency is to be measured to said input, phase shifting means connected to one or both of said outputs of said frequency splitter to advance the phase of said frequency stop output by 90° relative to said frequency pass output, and means to multiply said phase shifted outputs of said frequency splitter, the resultant product being applied to a low pass filter, the output of said low pass filter being the output of said discriminator.

8. The circuit of claim 7 wherein said frequency splitter comprises a parallel inductance-capacitance circuit with a resistor in series therewith, said input of said frequency splitter being applied across the entire circuit with the voltage across said resistor being said frequency stop output and said voltage across said inductance-capacitance being said frequency pass output.

9. The circuit of claim 7 wherein said frequency splitter comprises a parallel inductance-capacitance circuit with a grounded resistor in series therewith, said frequency splitter input being applied across said series-parallel circuit, said frequency stop output comprising the voltage across said resistor, and a winding with one side grounded inductively coupled to said inductance, the voltage in said winding comprising said frequency pass output.

10. The circuit of claim 7 wherein said frequency splitter comprises a capacitor and resistor connected in series with the input applied to both in series, and said frequency pass output comprising the voltage across said capacitor and said frequency stop output comprising the voltage across said resistor.

11. A frequency discriminator comprising; means to apply the signal to be measured to a pair of parallel channels, one of said channels comprising a frequency pass circuit and the other comprising a frequency stop circuit, each of said channels further comprising 45° phase shifters, one of said phase shifters retarding the phase by 45° and the other of said phase shifters advancing the phase by 45°, and means to multiply the outputs of said two channels to yield the discriminator output.

12. A frequency discriminator comprising; means to apply a signal to be measured to a pair of parallel channels, one of said channels comprising a frequency pass circuit and the other comprising a frequency stop circuit, said frequency pass and stop circuits both tuned to the same frequency, each of said channels further comprising phase shifters, the phase shifts of said phase shifters differing by 90°.

* * * * *